(12) United States Patent
Wu et al.

(10) Patent No.: US 6,187,668 B1
(45) Date of Patent: Feb. 13, 2001

(54) METHOD OF FORMING SELF-ALIGNED UNLANDED VIA HOLES

(75) Inventors: Hua-Shu Wu; Chun-Hung Peng, both of Hsinchu; Hung-Chan Lin, KaoShiung, all of (TW)

(73) Assignee: United Microelectronics Corp. (TW)

( * ) Notice: Under 35 U.S.C. 154(b), the term of this patent shall be extended for 0 days.

(21) Appl. No.: 09/347,977

(22) Filed: Jul. 6, 1999

(51) Int. Cl.$^7$ .................................................. H01L 21/4763
(52) U.S. Cl. ........................... 438/637; 438/623; 438/639
(58) Field of Search .................................... 438/637, 253, 438/586, 753, 305, 623, 639, 687

(56) References Cited

U.S. PATENT DOCUMENTS 5,989,967 * 11/1999 Gardner et al. ...................... 438/305
6,030,896 * 2/2000 Brown ................................... 438/687
6,037,211 * 3/2000 Jeng et al. ........................... 438/253
6,054,394 * 4/2000 Wang ................................... 438/753

* cited by examiner

Primary Examiner—David Nelms
Assistant Examiner—Phuc T. Dang (57) ABSTRACT

The present invention discloses a method of forming self-aligned unlanded via holes. First, a substrate having a patterned conductive layer on its surface is provided, and then a first dielectric layer is deposited on the substrate by using high density plasma chemical vapor deposition (HDP CVD). Next, a silicon nitride layer and a second dielectric layer are sequentially deposited on the first dielectric layer. Thereafter, the second dielectric layer, the silicon nitride layer and the first dielectric layer are etched back to remove a portion of the silicon nitride layer overlying the patterned conductive layer. Finally, a third dielectric layer is deposited, and then via holes are defined in the third dielectric layer.

17 Claims, 7 Drawing Sheets

FIG. 1

(PRIOR ART)

METHOD OF FORMING SELF-ALIGNED UNLANDED VIA HOLES

BACKGROUND OF THE INVENTION

1. Field of the Invention

The present invention relates to a method of forming self-aligned unlanded via holes of integrated circuits, and more particularly to a process of forming self-aligned unlanded via holes by depositing an HDP-CVD dielectric layer and a silicon nitride layer within.

2. Description of the Prior Art

The current trend in VLSI design toward denser and more complex circuitry produces closely spaced and smaller geometries on larger wafers, which results in narrower and longer interconnect lines. The increase of circuit density has obviously improved the performance of electric devices by reducing RC delay time and effectively decreased the cost. However, one of the limitations in a VLSI process is the size of a via hole (or via plug) which is formed for connecting two conductive layers. How to exactly define a smaller via hole to a proper position is a challenging issue for a VLSI fabrication.

Figure 1:
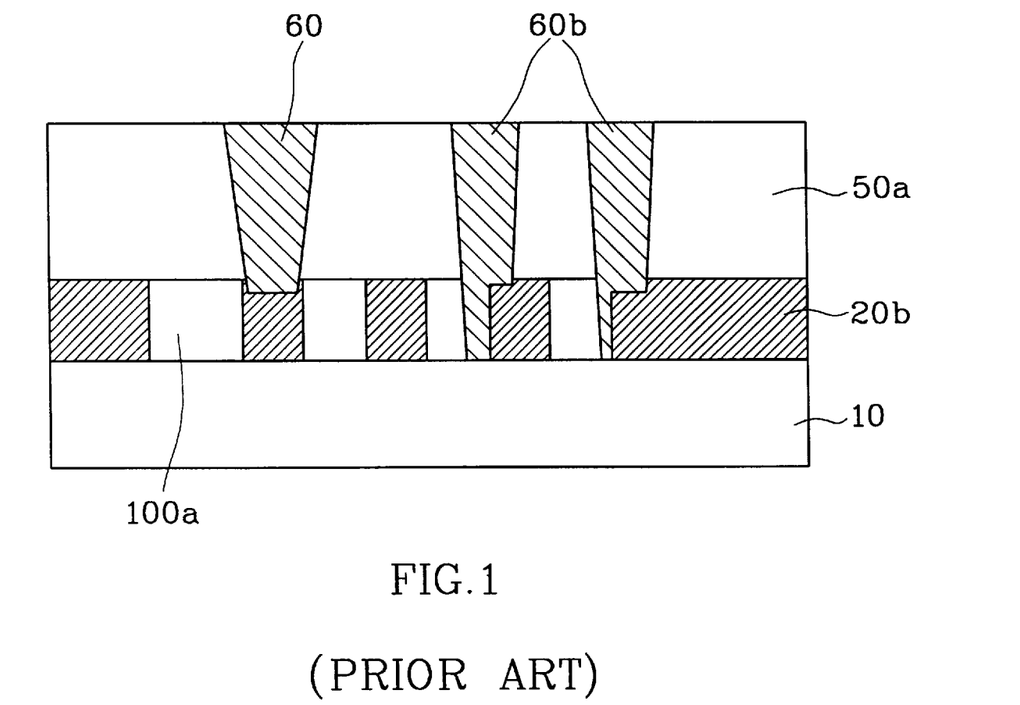
FIG. 1 is a cross-sectional view of part of a partially fabricated integrated circuit structure with via plugs according to the prior art.

The size of a via hole is usually smaller than the metal line width for avoiding the problem of misalignment induced during a step of photolithography. Please referring to FIG. 1, a cross-sectional view of part of a partially fabricated integrated circuit structure with via plugs according to the prior art is illustrated, the misalignment of via holes could induce a problem of over-etch to damage the first dielectric layer 100a and even the devices beneath. As a result, the misaligned via plugs 60b will be a problem of electric short.

Therefore, a self-aligned contact (SAC) process of forming via holes is developed for decreasing the size of each via hole with the misalignment problem.

SUMMARY OF THE INVENTION

Accordingly, it is an object of the present invention to provide a method of forming self-aligned unlanded via holes, wherein a silicon nitride layer is formed for the self-aligning process.

Another object of the present invention is to provide a method of forming self-aligned unlanded via holes for allowing the minimizing of mis-alignment in a photolithography step to increasing throughout.

In accordance with the objects of this invention, there is shown a method of forming self-aligned unlanded via holes. First, a substrate having a patterned conductive layer on its surface is provided, and then a first dielectric layer is deposited on the substrate by using high density plasma chemical vapor deposition (HDP CVD). Next, a silicon nitride layer and a second dielectric layer are sequentially deposited on the first dielectric layer. Thereafter, the second dielectric layer, the silicon nitride layer and the first dielectric layer are etched back to remove a portion of the silicon nitride layer overlying the patterned conductive layer. Finally, a third dielectric layer is deposited, and then via holes are defined in the third dielectric layer.

BRIEF DESCRIPTION OF THE DRAWINGS

FIGS. 2 A~E are cross-sectional views of part of a partially fabricated integrated circuit structure at successive stages in forming self-aligned via plugs according to a first embodiment of the present invention.

FIGS. 3 A~D is are cross-sectional views of part of a partially fabricated integrated circuit structure at successive stages in forming self-aligned via plugs according to a second embodiment of the present invention.

FIGS. 4 A~C are cross-sectional views of part of a partially fabricated integrated circuit structure at successive stages in forming self-aligned via plugs according to a third embodiment of the present invention.

DETAILED DESCRIPTION OF THE PREFERRED EMBODIMENT

Figure 2:
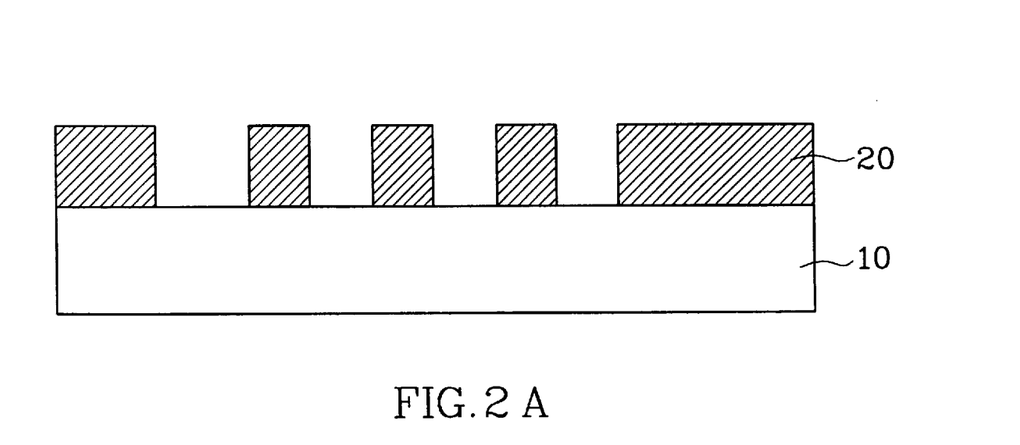

The present invention discloses a new method of forming selfaligned unlanded via holes of integrated circuits. Referring now in detail to the drawings for the purpose of illustrating preferred embodiments of the present invention, the process for forming self-aligned unlanded via holes is shown in FIGS. 2 to 4.

In the method of forming self-aligned unlanded via holes according to a first embodiment of the present invention, a substrate 10 is provided with a patterned conductive layer 20 on its surface, as shown in FIG. 2A. The patterned conductive layer 20 is a patterned layer of Al or Al/Cu or Al/Si/Cu. Next, referring to FIG. 2B, a first dielectric layer 100 is deposited using high density plasma chemical vapor deposition (HDP CVD), wherein the first dielectric layer 100 is silicon oxide. The ratio of the thickness of the first dielectric layer 100 to the thickness of the patterned conductive layer 20 is less than 1.5, especially between 1/2 and 4/3. According to the method of HDP CVD, the first dielectric layer 100 has a nonuniform thickness because of the large step high at the trenches of the conductive layer 20. The conformal structure of the first dielectric layer 100 is formed as shown in FIG. 2B.

Subsequently, referring now to FIG. 2C, a silicon nitride layer 30 and a second dielectric layer 40 are sequentially deposited on the first dielectric layer 100. The silicon nitride layer 30, having a thickness of 200 to 3000 Å, is formed by the method of low pressure chemical vapor deposition (LPCVD). And, the second dielectric layer 40, having a thickness of 2000 to 10000 Å, is formed by the method of plasma enhanced chemical vapor deposition (PECVD).

Figure 2D:
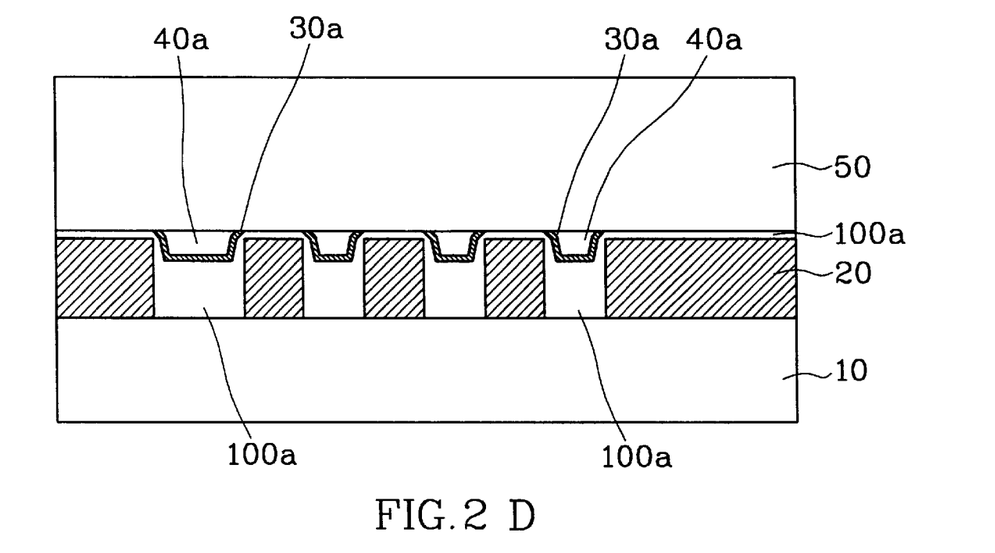

Then, a step of etching back is executed by using chemical mechanical polish (CMP) technology to planarize the surface of the substrate, wherein a portion of the silicon nitride layer 30 over the conductive layer 20 is removed in this step, as shown in FIG. 2D. The etching stop is controlled by time mode.

Next, still referring to FIG. 2D, a third dielectric layer 50 is deposited on the surface of the substrate. In this embodiment, the third dielectric layer 50, having a thickness of 2000 to 10000 Å, is a layer of silicon oxide formed by the method of plasma enhanced chemical vapor deposition (PECVD).

Figure 2E:
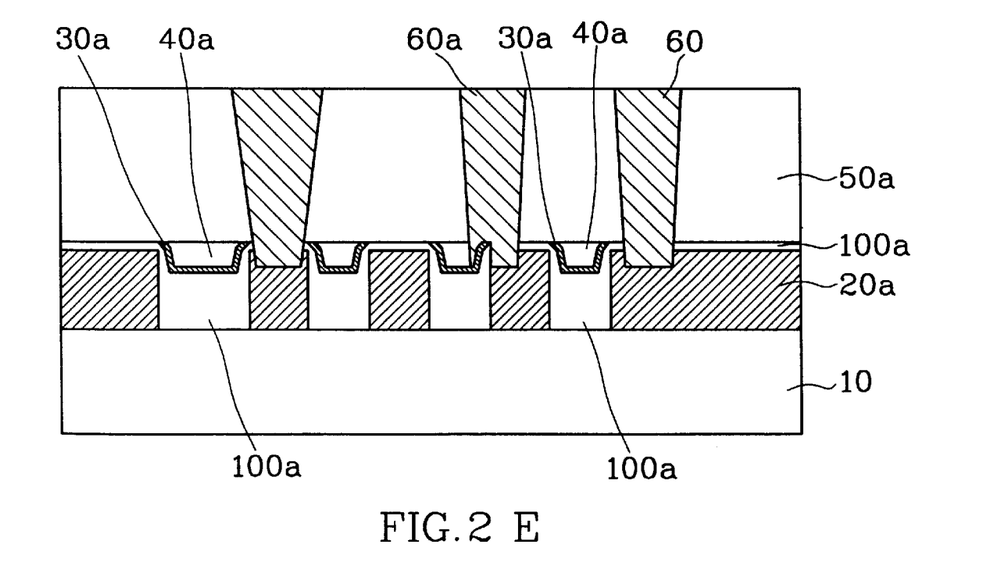

Finally, referring now to FIG. 2E, the third dielectric layer 50 is patterned by using the conventional photolithography step and dry etching to define via holes. In the present invention, even though misalignment happens in this process, the silicon nitride layer 30a can be an etching stop layer at the trench regions of the conductive layer 20 to protect the first dielectric layer 100a. Then, a layer of conductive material is deposited to fill the via holes for forming via plugs 60. The layer of conductive material is W, Al, Al/Cu alloy, or Al/Si/Cu alloy.

Because of the silicon nitride layer 30a, the via holes can be self-aligned at the location of the conductive layer 20.

The plug 60*a* in FIG. 2E illustrates a condition of misalignment. The silicon nitride layer 30*a* acts as a hard mask to solve the problem induced by misalignment in the prior art.

Figure 3A:
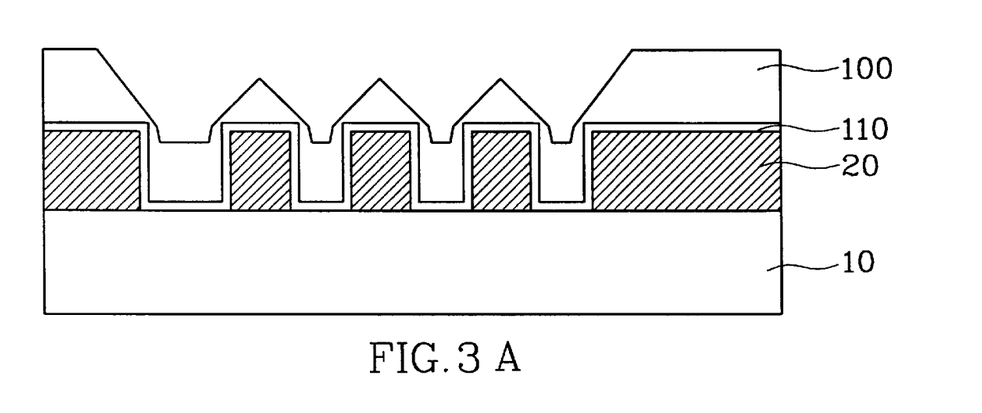
Figure 4:
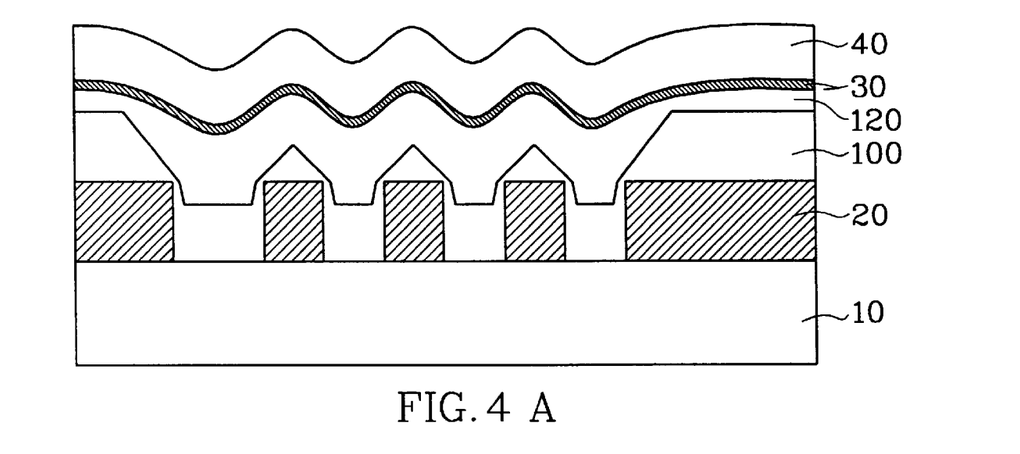

In the method of forming self-aligned unlanded via holes according to a second embodiment of the present invention, a substrate 10 is provided with a patterned conductive layer 20 on its surface, as shown in FIG. 3A. The patterned conductive layer 20 is a patterned layer of Al or Al/Cu or Al/Si/Cu. Next, a pad layer 110 is deposited to be a buffer layer for a subsequent CMP step. The pad layer 110, having a thickness of 500 to 2000 Å, is formed by the method of plasma enhanced chemical vapor deposition (PECVD).

Then, a first dielectric layer 100 is deposited using high density plasma chemical vapor deposition (HDP CVD), wherein the first dielectric layer 100 is silicon oxide. The ratio of the thickness of the first dielectric layer 100 to the thickness of the patterned conductive layer 20 is less than 1.5, especially between 1/2 and 4/3. According to the method of HDP CVD, the first dielectric layer 100 has a nonuniform thickness because of the large step high at the trenches of the conductive layer 20. The conformal structure of the first dielectric layer 100 is formed as shown in FIG. 3A.

Figure 3B:
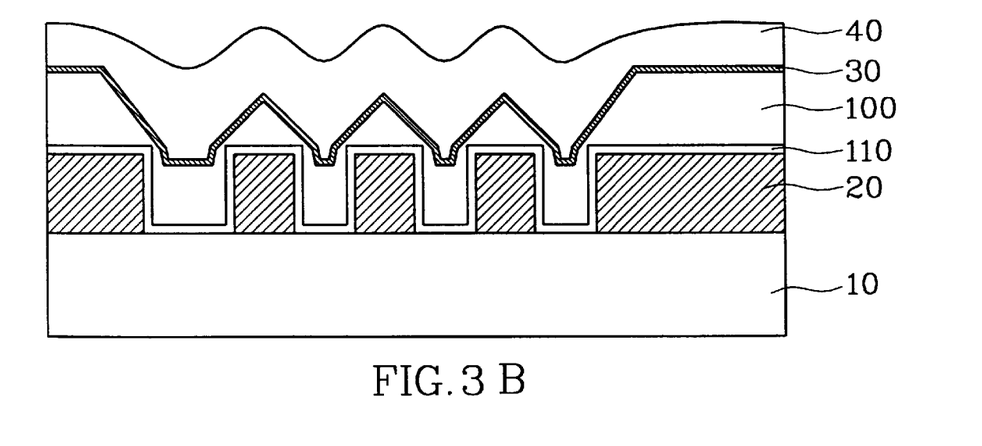

Subsequently, referring now to FIG. 3B, a silicon nitride layer 30 and a second dielectric layer 40 are sequentially deposited on the first dielectric layer 100. The silicon nitride layer 30, having a thickness of 200 to 3000 Å, is formed by the method of low pressure chemical vapor deposition (LPCVD). And, the second dielectric layer 40, having a thickness of 2000 to 10000 Å, is formed by the method of plasma enhanced chemical vapor deposition (PECVD).

Then, a step of etching back is executed by using chemical mechanical polish (CMP) technology to planarize the surface of the substrate, wherein a portion of the silicon nitride layer 30 over the conductive layer 20 is removed in this step. The etching stop is controlled by time mode. The pad layer 110 described above is used as a buffer layer for this CMP step to avoid an over polishing to the patterned conductive layer 20.

Figure 3C:
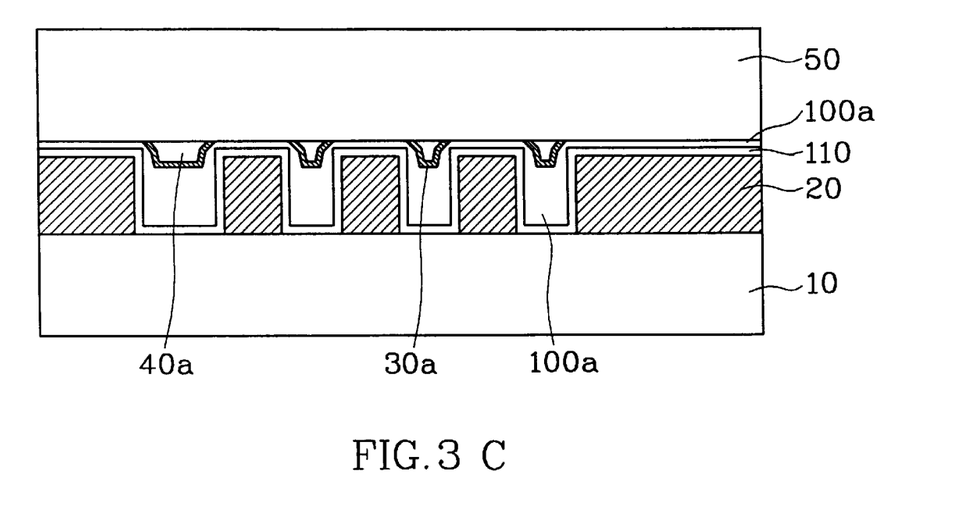

Next, still referring to FIG. 3C, a third dielectric layer 50 is deposited on the surface of the substrate. In this embodiment, the third dielectric layer 50, having a thickness of 2000 to 10000 Å, is a layer of silicon oxide formed by the method of plasma enhanced chemical vapor deposition (PECVD).

Figure 3D:
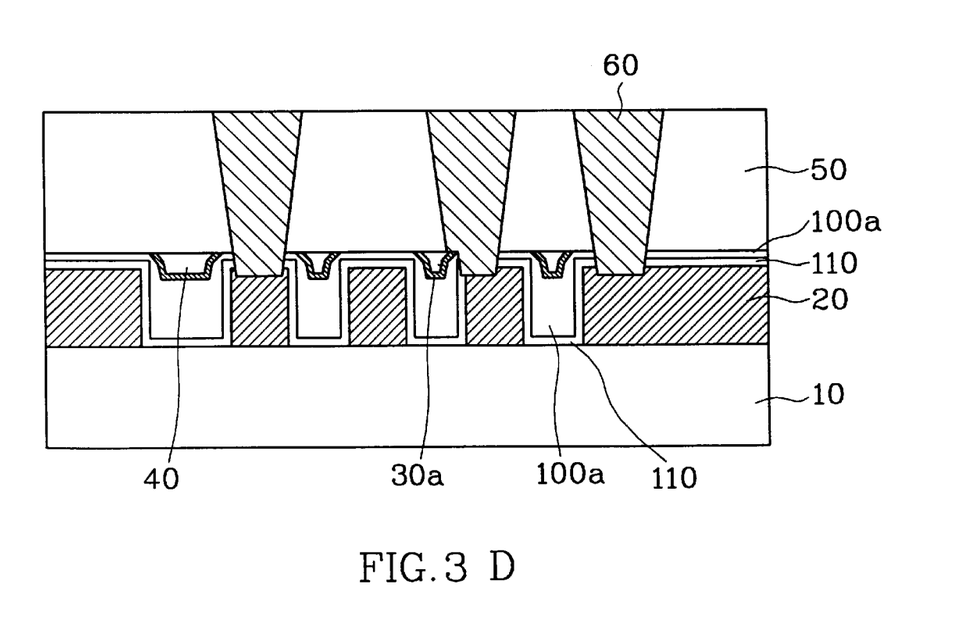

Finally, referring now to FIG. 3D, the third dielectric layer 50 is patterned by using the conventional photolithography step and dry etching to define via holes. In the present invention, even though misalignment happens in this process, the silicon nitride layer 30*a* can be an etching stop layer at the trench regions of the conductive layer 20 to protect the first dielectric layer 100*a*. Then, a layer of conductive material is deposited to fill the via holes for forming via plugs 60. The layer of conductive material is W, Al, Al/Cu alloy, or Al/Si/Cu alloy.

In the method of forming self-aligned unlanded via holes according to a third embodiment of the present invention, a substrate 10 is provided with a patterned conductive layer 20 on its surface, as shown in FIG. 4A. The patterned conductive layer 20 is a patterned layer of Al or Al/Cu or Al/Si/Cu. Next, a first dielectric layer 100 is deposited using high density plasma chemical vapor deposition (HDP CVD), wherein the first dielectric layer 100 is silicon oxide. The ratio of the thickness of the first dielectric layer 100 to the thickness of the patterned conductive layer 20 is less than 1.5, especially between 1/2 and 4/3. According to the method of HDP CVD, the first dielectric layer 100 has a nonuniform thickness because of the large step high at the trenches of the conductive layer 20. The conformal structure of the first dielectric layer 100 is formed as shown in FIG. 4A. Then, a pad layer 120 is deposited to be a buffer layer for a subsequent CMP step. The pad layer 120, having a thickness of 1000 to 5000 Å, is formed by the method of plasma enhanced chemical vapor deposition (PECVD).

Subsequently, still referring to FIG. 4A, a silicon nitride layer 30 and a second dielectric layer 40 are sequentially deposited on the first dielectric layer 100. The silicon nitride layer 30, having a thickness of 200 to 3000 Å, is formed by the method of low pressure chemical vapor deposition (LPCVD). And, the second dielectric layer 40, having a thickness of 2000 to 10000 Å, is formed by the method of plasma enhanced chemical vapor deposition (PECVD).

Then, a step of etching back is executed by using chemical mechanical polish (CMP) technology to planarize the surface of the substrate, wherein a portion of the silicon nitride layer 30 over the conductive layer 20 is removed in this step, as shown in FIG. 4B. 40*a* represents the residual second dielectric layer, and 30*a* represents the residual silicon nitride layer. The etching stop is controlled by time mode. The first dielectric layer 100 is almost retained.

Next, still referring to FIG. 4B, a third dielectric layer 50 is deposited on the surface of the substrate. In this embodiment, the third dielectric layer 50, having a thickness of 2000 to 10000 Å, is a layer of silicon oxide formed by the method of plasma enhanced chemical vapor deposition (PECVD).

Figure 4C:
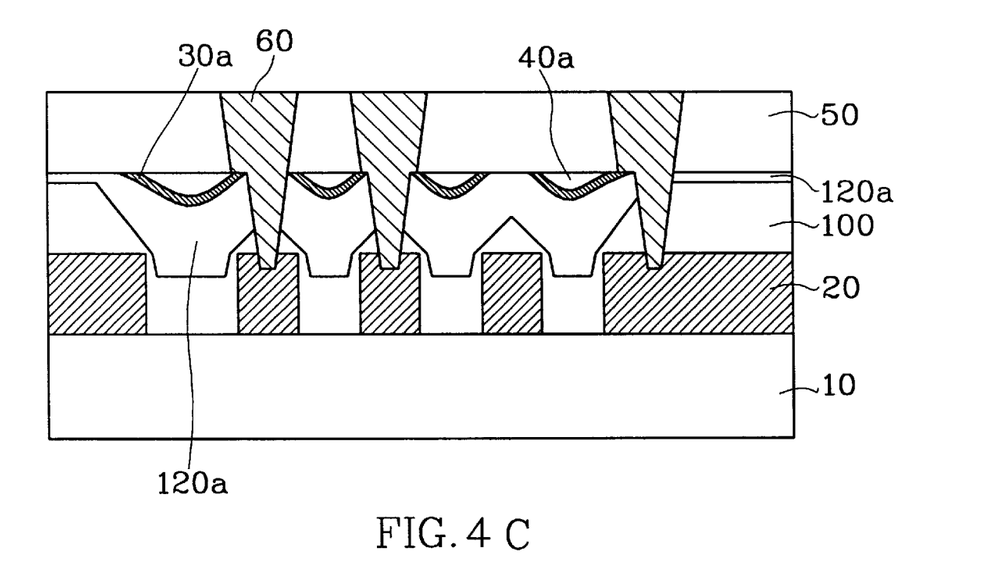

Finally, referring now to FIG. 4C, the third dielectric layer 50 is patterned by using the conventional photolithography step and dry etching to define via holes. In the present invention, even though misalignment happens in this process, the silicon nitride layer 30*a* can be an etching stop layer at the trench regions of the conductive layer 20 to protect the first dielectric layer 100. Then, a layer of conductive material is deposited to fill the via holes for forming via plugs 60. The layer of conductive material is W, Al, Al/Cu alloy, or Al/Si/Cu alloy.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A method of forming self-aligned unlanded via holes, comprising:
   (a) providing a substrate having a patterned conductive layer on its surface;
   (b) depositing a first dielectric layer on said substrate by using high density plasma chemical vapor deposition (HDP CVD);
   (c) depositing a silicon nitride etch stop layer on said first dielectric layer;
   (d) depositing a second dielectric layer on said silicon nitride layer;
   (e) etching back said second dielectric layer, said silicon nitride layer and said first dielectric layer to remove a portion of said silicon nitride layer overlying said patterned conductive layer;
   (f) depositing a third dielectric layer on said substrate; and
   (g) defining via holes in said third dielectric layer.

2. The method of claim 1, wherein said first dielectric layer is silicon oxide.

3. The method of claim 1, wherein the ratio of the thickness of said first dielectric layer to the thickness of said patterned conductive layer is less than 1.5.

4. The method of claim 1, wherein said silicon nitride layer has a thickness of 200 to 3000 Å.

5. The method of claim 1, wherein said second dielectric layer has a thickness of 2000 to 10000 Å.

6. The method of claim 1, wherein said etching back in step (e) is using chemical mechanical polishing (CMP).

7. A method of forming self-aligned unlanded via holes, comprising:
   (a) providing a substrate having a patterned conductive layer on its surface;
   (b) depositing a buffer layer over said substrate and said patterned conductive layer;
   (c) depositing a first dielectric layer on said buffer layer by using high density plasma chemical vapor deposition (HDP CVD);
   (d) depositing a silicon nitride etch stop layer on said first dielectric layer;
   (e) depositing a second dielectric layer on said silicon nitride layer;
   (f) etching back said second dielectric layer, said silicon nitride layer and said first dielectric layer to remove a portion of said silicon nitride layer overlying said buffer layer;
   (g) depositing a third dielectric layer on said substrate; and
   (h) defining via holes in said third dielectric layer.

8. The method of claim 7, wherein said first dielectric layer is silicon oxide.

9. The method of claim 7, wherein the ratio of the thickness of said first dielectric layer to the thickness of said patterned conductive layer is less than 1.5.

10. The method of claim 7, wherein said silicon nitride layer has a thickness of 200 to 3000 Å.

11. The method of claim 7, wherein said second dielectric layer has a thickness of 2000 to 10000 Å.

12. The method of claim 7, wherein said etching back in step (f) is using chemical mechanical polishing (CMP).

13. A method of forming self-aligned unlanded via holes, comprising:
   (a) providing a substrate having a patterned conductive layer on its surface;
   (b) depositing a first dielectric layer on said substrate by using high density plasma chemical vapor deposition (HDP CVD);
   (c) depositing a buffer layer on said first dielectric layer;
   (d) depositing a silicon nitride etch stop layer on said buffer layer;
   (e) depositing a second dielectric layer on said silicon nitride layer;
   (f) etching back portions of said second dielectric layer, portions of said silicon nitride layer and portions of said buffer layer;
   (g) depositing a third dielectric layer on said substrate; and
   (h) defining via holes in said third dielectric layer.

14. The method of claim 13, wherein said first dielectric layer is silicon dioxide.

15. The method of claim 13, wherein the ratio of the thickness of said first dielectric layer to the thickness of said patterned conductive layer is less than 1.5.

16. The method of claim 13, wherein the etching of step (f) does not etch the first dielectric layer.

17. The method of claim 1, wherein the first dielectric layer has a non-uniform thickness after it has been deposited.

* * * * *